(12) United States Patent
Chang et al.

(10) Patent No.: US 11,508,435 B2
(45) Date of Patent: Nov. 22, 2022

(54) CHARGE PUMP APPARATUS AND CALIBRATION METHOD THEREOF

(71) Applicant: eMemory Technology Inc., Hsinchu (TW)

(72) Inventors: Chia-Fu Chang, Hsinchu County (TW); Sung-Ling Hsieh, Hsinchu County (TW)

(73) Assignee: eMemory Technology Inc., Hsinchu (TW)

(*) Notice: Subject to any disclaimer, the term of this patent is extended or adjusted under 35 U.S.C. 154(b) by 0 days.

(21) Appl. No.: 17/379,989

(22) Filed: Jul. 19, 2021

(65) Prior Publication Data

US 2022/0115948 A1 Apr. 14, 2022

Related U.S. Application Data

(60) Provisional application No. 63/090,765, filed on Oct. 13, 2020.

(51) Int. Cl.
*H02M 3/07* (2006.01)
*G11C 11/56* (2006.01)
*G11C 16/10* (2006.01)
*G11C 16/34* (2006.01)
*G11C 16/04* (2006.01)
*G11C 16/30* (2006.01)

(52) U.S. Cl.
CPC ...... *G11C 11/5628* (2013.01); *G11C 16/0408* (2013.01); *G11C 16/10* (2013.01); *G11C 16/3459* (2013.01); *H02M 3/07* (2013.01); *G11C 16/30* (2013.01)

(58) Field of Classification Search
CPC .................. H02M 3/07; G11C 16/30
See application file for complete search history.

(56) References Cited

U.S. PATENT DOCUMENTS

| 6,741,195 | B1* | 5/2004 | Cho | H03M 1/0872 341/135 |
| 7,683,700 | B2 | 3/2010 | Huynh et al. | |
| 8,669,754 | B2* | 3/2014 | Bellaouar | H04B 15/06 323/314 |

(Continued)

FOREIGN PATENT DOCUMENTS

| TW | 202004757 A | 1/2020 |
| TW | 202010255 A | 3/2020 |

*Primary Examiner* — Sibin Chen
(74) *Attorney, Agent, or Firm* — CKC & Partners Co., LLC

(57) ABSTRACT

A charge pump apparatus including a first charge pump system, a second charge pump system, a switch transistor, and a voltage regulation circuit is provided. The first charge pump system converts a first supply voltage into a first boost voltage. The second charge pump system converts a second supply voltage into a second boost voltage. The switch transistor is coupled to the first charge pump system and the second charge pump system, and outputs an output voltage according to the second boost voltage. The switch transistor includes a control terminal receiving the second boost voltage, a first terminal receiving the first boost voltage, and a second terminal outputting the output voltage. The voltage regulation circuit controls the second charge pump system according to the output voltage to adjust the second boost voltage so that the output voltage approaches to a target output value.

18 Claims, 9 Drawing Sheets

(56) References Cited

U.S. PATENT DOCUMENTS

| | | | |
|---|---|---|---|
| 9,395,728 B2 | 7/2016 | Chiu et al. | |
| 9,455,039 B2 | 9/2016 | Lin | |
| 10,606,299 B2* | 3/2020 | Tang | G11C 16/30 |
| 2010/0156518 A1* | 6/2010 | Hoque | G05F 1/56 |
| | | | 327/538 |
| 2012/0256613 A1 | 10/2012 | Bellaouar et al. | |
| 2019/0318790 A1 | 10/2019 | Tang et al. | |

* cited by examiner

CHARGE PUMP APPARATUS AND CALIBRATION METHOD THEREOF

RELATED APPLICATIONS

This application claims priority to U.S. Provisional Application Ser. No. 63/090,765, filed Oct. 13, 2020, which is herein incorporated by reference in its entirety.

BACKGROUND

Technical Field

The present disclosure relates to a charge pump apparatus and a related calibration method. More particularly, the present disclosure relates to a charge pump apparatus and a related calibration method that adaptively compensate an output voltage.

Description of Related Art

Charge pump apparatuses are widely used in peripheral circuits of flash memories and electrically erasable programmable read only memories (EEPROMs), since these devices require high voltage pulse to program or erase data. In general, charge pump apparatuses include multiple charge pump units that from an array, in which charge pump units are each composed of switches and capacitors to generate an output voltage higher than voltages provided by the power input. Charge pump apparatuses should supply a stable output voltage for different loads, that is, the output voltage should have ripples with small amplitude. Although a charge pump apparatus can include bypass capacitors to suppress ripples, process variation of the charge pump apparatus itself, variation of the power input, and uncertain magnitude of the load may cause unstable ripples, resulting that the charge pump apparatus or the load may be operated out of the safe operating area (SOA). In addition, in some electronic devices that have high performance, operating time for the load (e.g., the memory) is less than 100 nanoseconds (ns). Therefore, the charge pump apparatus is required to determine the driving capability thereof in an extremely short time period. The known designs of charge pump apparatuses are, however, cannot satisfy this requirement for high-speed operation, and the load may therefore receiving not enough driving currents.

SUMMARY

The disclosure provides a charge pump apparatus including a first charge pump system, a second charge pump system, a switch transistor, and a voltage regulation circuit. The first charge pump system is configured to convert a first supply voltage into a first boost voltage. The second charge pump system is configured to convert a second supply voltage the same or different from the first supply voltage into a second boost voltage. The switch transistor is coupled to the first charge pump system and the second charge pump system, and is configured to output an output voltage according to the second boost voltage. The switch transistor includes a control terminal receiving the second boost voltage, a first terminal receiving the first boost voltage, and a second terminal outputting the output voltage. The voltage regulation circuit is coupled between the second terminal and the second charge pump system, and is configured to control the second charge pump system according to the output voltage to adjust the second boost voltage so that the output voltage approaches to a target output value.

The disclosure provides a calibration method suitable for a charge pump apparatus including a first charge pump system, a second charge pump system, and a switch circuit. The calibration method includes the following operations: supplying a first boost voltage to a first terminal of the switch transistor by the first charge pump system; supplying a second boost voltage to a control terminal of the switch transistor by the second charge pump system, wherein the switch transistor further comprises a second terminal configured to output an output voltage; and controlling, according to the output voltage, the second charge pump system to adjust the second boost voltage so that the output voltage approaches to a target output value.

The disclosure provides a charge pump apparatus including a first charge pump system, a second charge pump system, a switch circuit, and a driving capability setting circuit. The first charge pump system is configured to convert a first supply voltage into a first boost voltage, and includes a plurality of first charge pump units. The second charge pump system is configured to convert a second boost voltage the same or different from the first supply voltage into a second boost voltage. The switch transistor is coupled to the first charge pump system and the second charge pump system, and is configured to output an output voltage according to the second boost voltage. The switch transistor includes a control terminal receiving the second boost voltage, a first terminal receiving the first boost voltage, and a second terminal outputting the output voltage. The driving capability setting circuit is coupled with the first charge pump system. The driving capability setting circuit is configured to control, according to the first boost voltage, the first charge pump system to adjust a number of enabled first charge pump units of the plurality of first charge pump units, so that the first boost voltage approaches to a target boost value.

It is to be understood that both the foregoing general description and the following detailed description are by examples, and are intended to provide further explanation of the disclosure as claimed.

DETAILED DESCRIPTION

Figure 1:
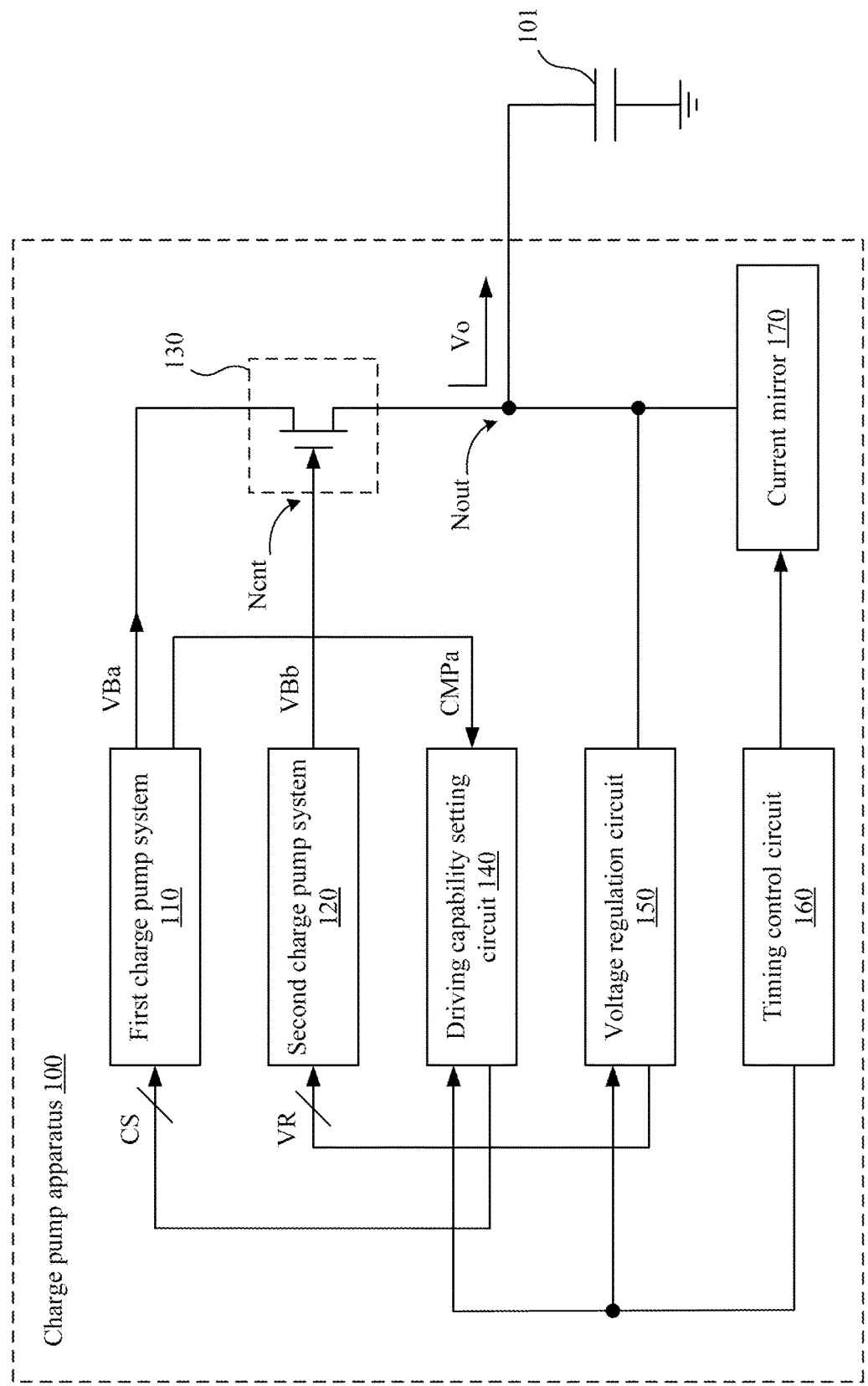
FIG. 1 is a simplified functional block diagram of a charge pump apparatus according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a charge pump apparatus 100 according to one embodiment of the present disclosure. The charge pump apparatus 100 is coupled with a capacitive load 101 through an output node Nout of the charge pump apparatus 100, and configured to supply an output voltage Vo to the load 101 via the output node Nout. In some embodiments, the load 101 may be a driver circuit for driving a memory array, by using the output voltage Vo as a power input. In other embodiments, the load 101 may be a memory array.

The charge pump apparatus 100 comprises a first charge pump system 110, a second charge pump system 120, and a switch transistor 130. A first terminal of the switch transistor 130 is coupled with the first charge pump system 110, and a second terminal of the switch transistor 130 is coupled with the output node Nout, in which a control terminal Ncnt of the switch transistor 130 is coupled with the second charge pump system 120. The first charge pump system 110 is configured to supply a first boost voltage VBa to the switch transistor 130. The second charge pump system 120 is configured to supply a second boost voltage VBb to the control terminal Ncnt of the switch transistor 130 so as to determine a degree of conduction of the switch transistor 130. Therefore, the switch transistor 130 may supply the output voltage Vo to the output node Nout according to the second boost voltage VBb. In some embodiments, the second boost voltage VBb is smaller than the first boost voltage VBa, and thus the switch transistor 130 is capable of suppressing ripples of the first boost voltage VBa to stable the output voltage Vo. In other embodiments, the switch transistor 130 is a native transistor, and the native transistor is capable of setting the output voltage Vo to the second boost voltage VBb minus a threshold voltage of the native transistor.

As shown in FIG. 1, the charge pump apparatus 100 further comprises a driving capability setting circuit 140 and a voltage regulation circuit 150. The driving capability setting circuit 140 is coupled with the first charge pump system 110, and is configured to receive the comparison signal CMPa from the first charge pump system 110 and to output a driving capability setting signal CS accordingly. The driving capability setting circuit 140 may use the driving capability setting signal CS to successively adjust the driving capability (i.e., an output current) of the first charge pump system 110. The voltage regulation circuit 150 is coupled with the second terminal of the switch transistor 130 through the output node Nout, and is configured to receive the output voltage Vo so as to output a voltage regulation signal VR to the second charge pump system 120 accordingly. The second charge pump system 120 is further configured to use the voltage regulation signal VR to successively adjust the level of the second boost voltage VBb.

The charge pump apparatus 100 further comprises a timing control circuit 160 and a current mirror 170 in some embodiments. The timing control circuit 160 is coupled with the driving capability setting circuit 140, the voltage regulation circuit 150, and the current mirror 170. The timing control circuit 160 is configured to control the timing of the driving capability adjustment performed by the driving capability setting circuit 140, and to control the timing of the voltage adjustment performed by the voltage regulation circuit 150. In addition, the current mirror 170 is configured to drain an adjustable current from the output node Nout when the driving capability adjustment or the voltage adjustment is performed.

Figure 2:
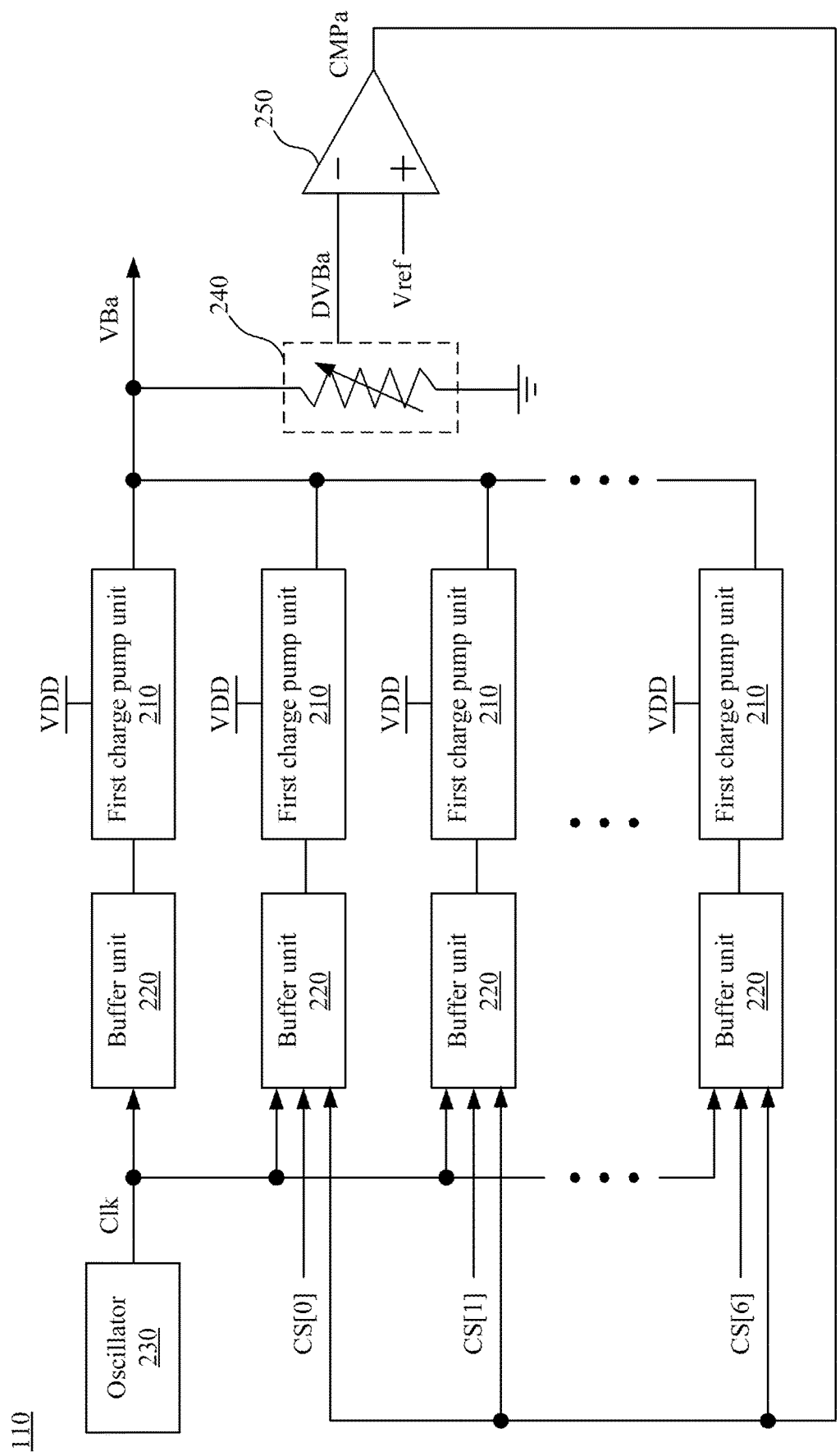
FIG. 2 is a simplified functional block diagram of the first charge pump system according to one embodiment of the present disclosure.

FIG. 2 is a simplified functional block diagram of the first charge pump system 110 according to one embodiment of the present disclosure. Reference is made to FIG. 1 and FIG. 2. The first charge pump system 110 comprises a plurality of first charge pump units 210, a plurality of buffer units 220, and an oscillator 230. For the convenience of explanation, a number of the first charge pump units 210 and a number of the buffer units 220 are assumed to be eight (8), but this disclosure is not limited thereto. The buffer units 220 have different delay times, and the oscillator 230 is configured to provide a clock signal Clk to the buffer units 220. The buffer units 220 and the oscillator 230 are configured to cooperatively drive the first charge pump units 210, so that the first charge pump units 210 convert a supply voltage VDD into the first boost voltage VBa. The first charge pump system 110 further comprises a voltage dividing circuit 240 and a comparator 250. The voltage dividing circuit 240 is configured to divide the first boost voltage VBa to generate a divided first boost voltage DVBa. The comparator 250 is configured to compare the divided first boost voltage DVBa with a reference voltage Vref to generate a comparison signal CMPa which controls the buffer units 220 to be enabled or disabled. For the convenience of explanation, multiple circuit blocks of this disclosure are assumed to use the same reference voltage Vref, but this disclosure is not limited thereto.

The first boost voltage VBa is increased because of the output currents of the first charge pump units 210, and is reduced because of leakage currents through the load 101. The buffer units 220 are disabled by the comparison signal CMPa when the divided first boost voltage DVBa is greater than or equal to the reference voltage Vref. On the other hand, when the divided first boost voltage DVBa is smaller than the reference voltage Vref, the buffer units 220 are enabled by the comparison signal CMPa. That is, the voltage dividing circuit 240 and the comparator 250 are configured to determine if the first boost voltage VBa is greater (or smaller) than a predetermined value set due to the resistance of the voltage dividing circuit 240 (hereinafter referred to as a "target boost value"). For example, if the first boost voltage VBa is greater than or equal to the target boost value, the divided first boost voltage DVBa is greater than or equal to the reference voltage Vref. On the other hand, if the first boost voltage VBa is smaller than the target boost value, the divided first boost voltage DVBa is smaller than the reference voltage Vref. When the first boost voltage VBa is not smaller than the target boost value, it is indicated that the first charge pump system 110 has a driving capability capable of providing sufficient currents to the load 101.

The driving capability setting signal CS outputted by the driving capability setting circuit 140 comprises a code having a plurality of bits CS[0]-CS[6] provided to the buffer units 220, respectively, as shown in FIG. 2. The driving capability setting circuit 140 determines a maximum number of first charge pump units 210 that can be enabled for driving the load 101, which will be explained in the following paragraphs. The number of first charge pump units 210 of FIG. 2 is merely an exemplary example, which is not intended to restrict the practical implementation of the first charge pump system 110. In some embodiments, the number of the first charge pump units 210 can be designed based on practical driving capability requirement.

Figure 3:
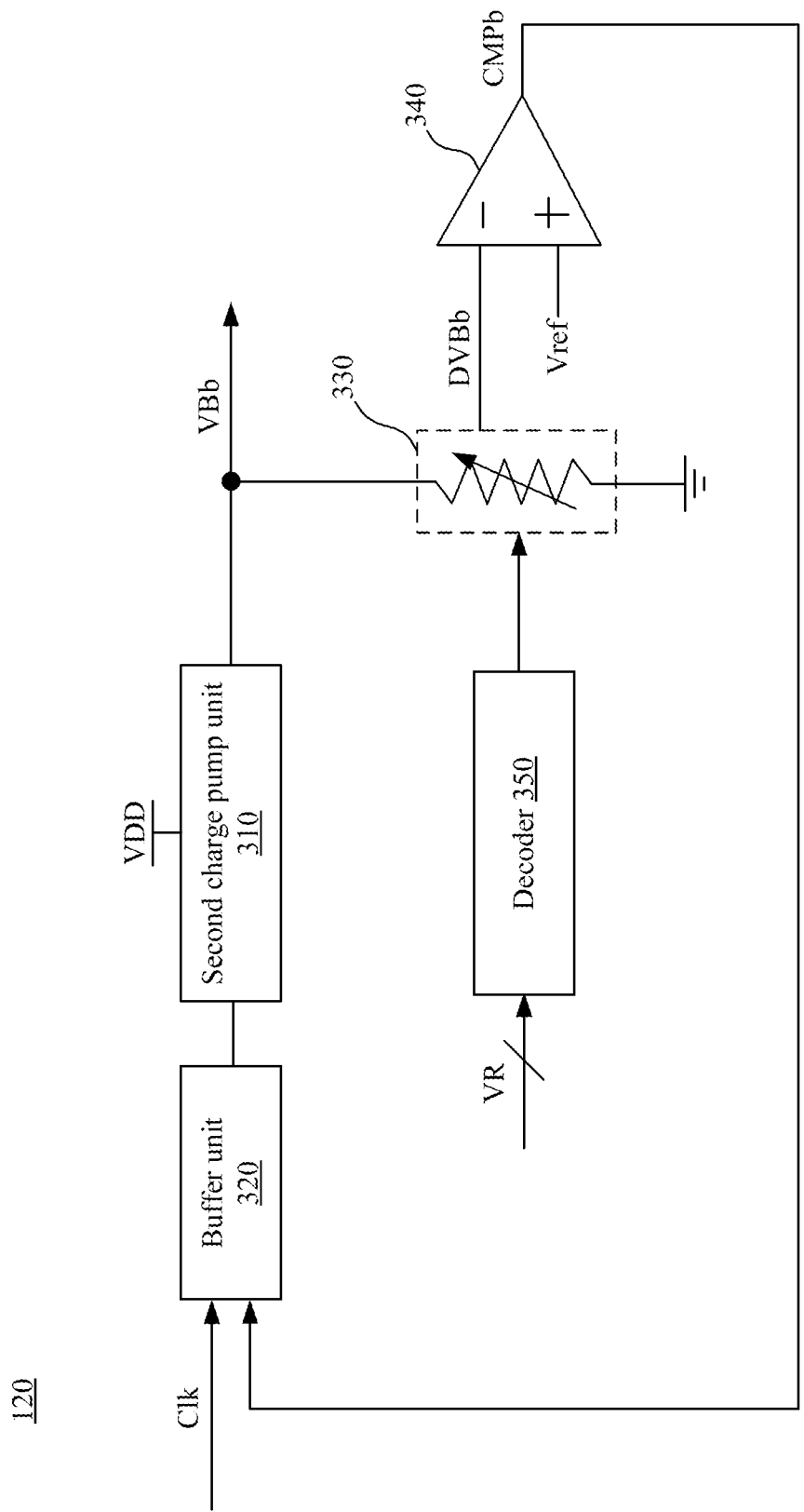
FIG. 3 is a simplified functional block diagram of the second charge pump system according to one embodiment of the present disclosure.

FIG. 3 is a simplified functional block diagram of the second charge pump system 120 according to one embodiment of the present disclosure. Reference is made to FIG. 1 and FIG. 3. The second charge pump system 120 comprises a second charge pump unit 310 and a buffer unit 320. The buffer unit 320 is configured to receive the clock signal Clk from the oscillator 230 of FIG. 2, or to receive a clock signal from a different oscillator (not shown). The buffer unit 320 is also configured to drive the second charge pump unit 310, so that the second charge pump unit 310 converts the supply voltage VDD into the second boost voltage VBb, but this disclosure is not limited thereto. In some embodiments, the supply voltage received by the first charge pump units 210 may be different from that of the second charge pump unit 310. The second charge pump system 120 further comprises a voltage dividing circuit 330 and a comparator 340. The voltage dividing circuit 330 is configured to divide the second boost voltage VBb to generate a divided second boost voltage DVBb. The comparator 340 is configured to compare the divided second boost voltage DVBb with the reference voltage Vref to generate a comparison signal CMPb. The buffer unit 320 is disabled by the comparison signal CMPb when the divided second boost voltage DVBb is greater than or equal to the reference voltage Vref. On the other hand, when the divided second boost voltage DVBb is reduced due to leakage currents and becomes smaller than the reference voltage Vref, the buffer unit 320 is enabled by the comparison signal CMPb.

As shown in FIG. 3, a decoder 350 of the second charge pump system 120 is configured to decode the voltage regulation signal VR outputted by the voltage regulation circuit 150, in which the voltage dividing circuit 330 adjusts resistance thereof according to the decoded voltage regulation signal VR from the decoder 350. The voltage regulation circuit 150 is configured to use the voltage regulation signal VR to successively adjust the resistance of the voltage dividing circuit 330 to determine the level of the second boost voltage VBb, which will be explained in the following paragraph.

Figure 4:
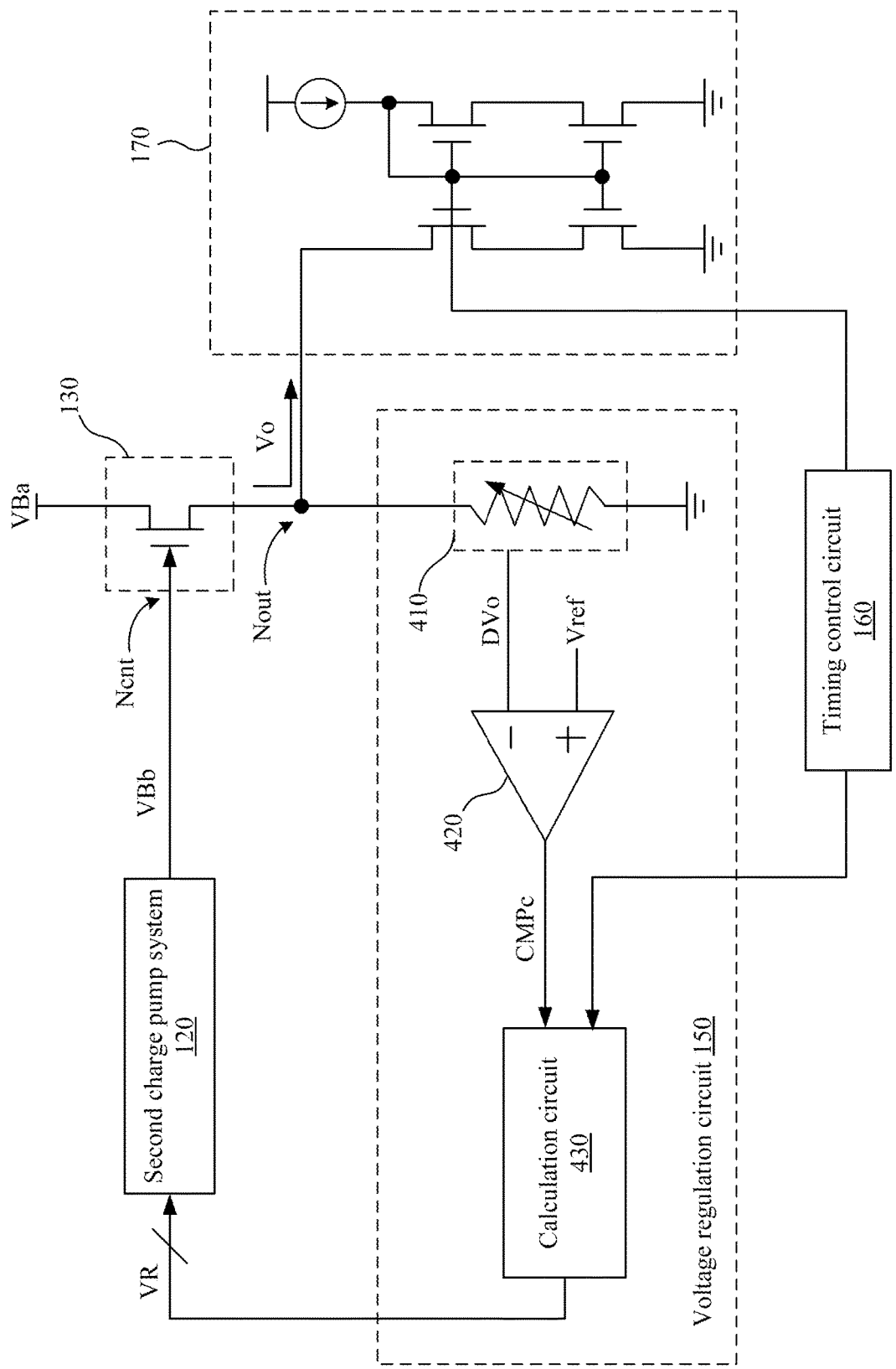
FIG. 4 is a simplified functional block diagram for illustrating the voltage regulation circuit according to one embodiment of the present disclosure.

FIG. 4 is a simplified functional block diagram for illustrating the voltage regulation circuit 150 according to one embodiment of the present disclosure. The voltage regulation circuit 150 comprises a voltage dividing circuit 410, a comparator 420, and a calculation circuit 430. The voltage dividing circuit 410 is coupled with the current mirror 170 through the output node Nout, and is configured to divide the output voltage Vo to generate a divided output voltage DVo. The comparator 420 is configured to compare the divided output voltage DVo with the reference voltage Vref, so as to output a comparison signal CMPc to the calculation circuit 430. In other words, the voltage dividing circuit 410 and the comparator 420 are used to determine if the output voltage Vo is greater (or smaller) than a predetermined value set due to the resistance of the voltage dividing circuit 410 (hereinafter referred to as a "target output value"). For example, if the output voltage Vo is greater than or equal to the target output value, the divided output voltage DVo is greater than or equal to the reference voltage Vref. On the other hand, if the output voltage Vo is smaller than the target output value, the divided output voltage DVo is smaller than the reference voltage Vref.

In some embodiments, the target output value is the voltage level needed for driving the load 101. The calculation circuit 430 is coupled with the comparator 420 and the timing control circuit 160, and is configured to output the voltage regulation signal VR to the second charge pump system 120, in which the calculation circuit 430 successively adjusts a code included by the voltage regulation signal VR according to the comparison signal CMPc. In some embodiments, the code of the voltage regulation signal VR which rendering the output voltage Vo closest to the target output value will be stored in a memory circuit (not shown) of the charge pump apparatus 100 for thereafter configuring the second boost voltage VBb when driving the load 101.

In one embodiment, for example, the second charge pump unit 310 may output a voltage within a range of 3.2-3.5 V, and the voltage regulation signal VR includes a code of 3-bit. Therefore, the voltage dividing circuit 330 of FIG. 3 may have adjustable resistance with seven (7) scales, in which when the scale is switched from one to another, the maximum level of the second boost voltage VBb increases or decreases by 0.05 V. For instance, when the calculation circuit 430 successively adjusts the code of the voltage regulation signal VR from "001" to "110," the maximum level of the second boost voltage VBb successively increases from 3.2 V to 3.5 V in a unit of 0.05 V. Therefore, in an embodiment that the output voltage Vo is smaller than the target output value (e.g., 3.4 V), the calculation circuit 430 successively increases the code of the voltage regulation signal VR so as to increase the second boost voltage VBb (e.g., from 3.2 V to 3.35 V), and thus the output voltage Vo successively increases (approaches) to the target output value, and vice versa. Additionally, when the code of the voltage regulation signal VR is adjusted, the timing control circuit 160 enables the current mirror 170 to drain an adjustable current from the output node Nout, in order to simulate effects to the output voltage Vo caused by the load 101.

In some embodiments, the voltage regulation circuit 150 is configured to adjust the code of the voltage regulation signal VR by using a binary search algorithm according to a comparison result between the output voltage Vo and the target output value. Specifically, the calculation circuit 430 is configured to use the binary search algorithm to adjust the code of the voltage regulation signal VR according to a comparison result, indicated by the comparison signal CMPc, between the divided output voltage DVo and the reference voltage Vref.

Figure 5:
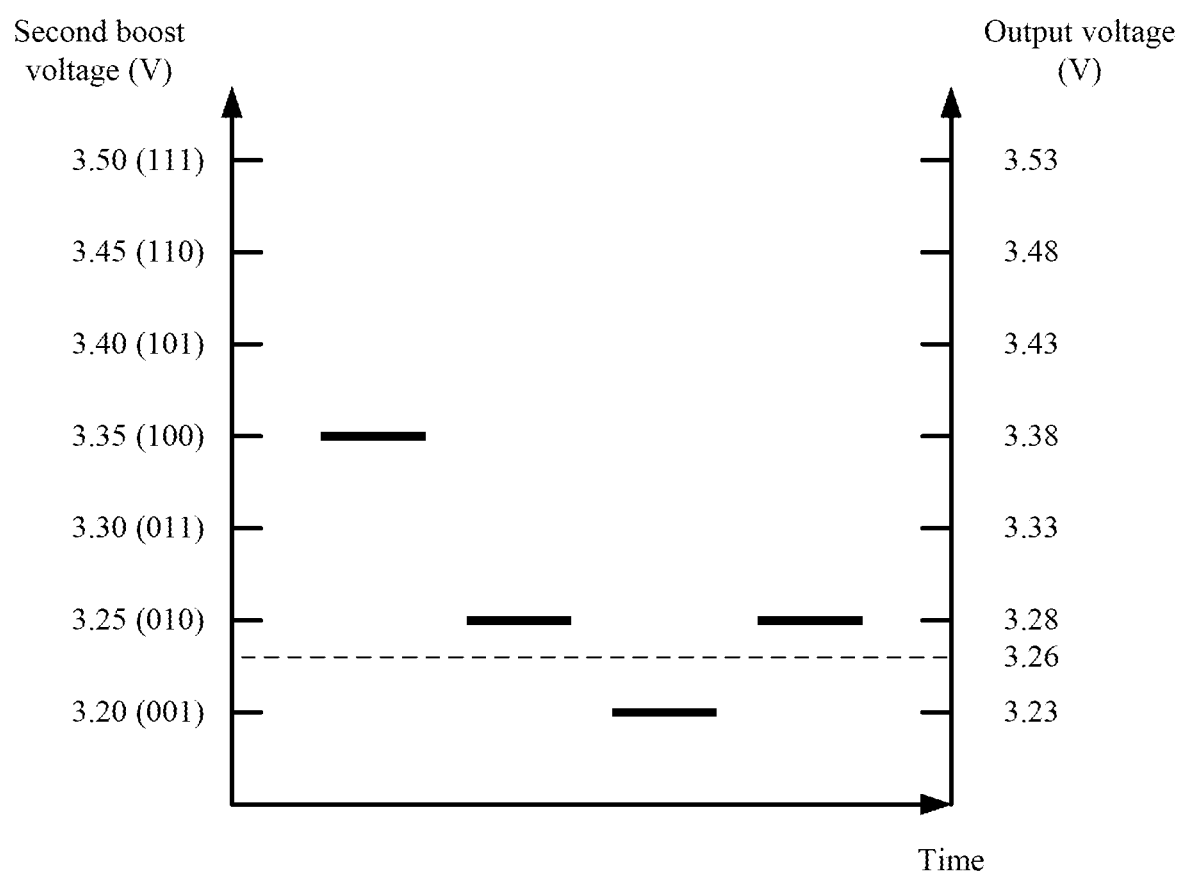
FIG. 5 is a schematic diagram for illustrating the binary search algorithm executed by the calculation circuit.

FIG. 5 is a schematic diagram for illustrating the binary search algorithm executed by the calculation circuit 430. In this embodiment, the output range of the second charge pump unit 310 is 3.2-3.5 V, and the voltage regulation signal VR includes a 3-bit code which may be adjusted from "001" to "111." Therefore, the voltage dividing circuit 330 has adjustable resistance with seven (7) scales, and the second boost voltage VBb may varies within the range of 3.2-3.5 V by increasing or decreasing the value thereof in a unit of 0.05 V, similar to which is described above. The native transistor of the switch transistor 130 has a threshold voltage (Vth) of −0.03 V, causing that the output voltage Vo is 0.03 V higher than the second boost voltage VBb, but this disclosure is not limited thereto. In practice, the threshold voltage of the native transistor may vary with variation of fabrication process. When executing the binary search algorithm, as shown in FIG. 5, the calculation circuit 430 first set the MSB of the code of the voltage regulation signal VR to one (1), resulting the second boost voltage VBb of 3.35 V and the output voltage Vo of 3.38 V. Next, since the output voltage Vo (i.e., 3.38 V) is greater than the target output value of 3.26 V indicated by a dashed line, the MSB and the second MSB of the code of the voltage regulation signal VR are set to zero (0) and one (1), respectively, resulting the second boost voltage VBb of 3.25 V and the output voltage Vo of 3.28 V. The binary search algorithm is apparent to those of ordinary skill in the art, and thus the rest of the search process is omitted here. At the end of executing the binary search algorithm, the code of the voltage regulation signal VR is set to "010," rendering the second boost voltage VBb of 3.25 V and the output voltage Vo of 3.28 V close to the target output value of 3.26 V. Accordingly, the code of the voltage regulation signal VR is successively adjusted by using the binary search algorithm. In the circumstance that the voltage dividing circuit 330 has adjustable resistance with M scales and M is a considerably large integer, the number of search times by using the binary search algorithm is $\log_2 M$. This is dramatically smaller than the number of search times that sequentially adjusting the resistance of the voltage dividing circuit 330 by each scale among the M scales.

Figure 6:
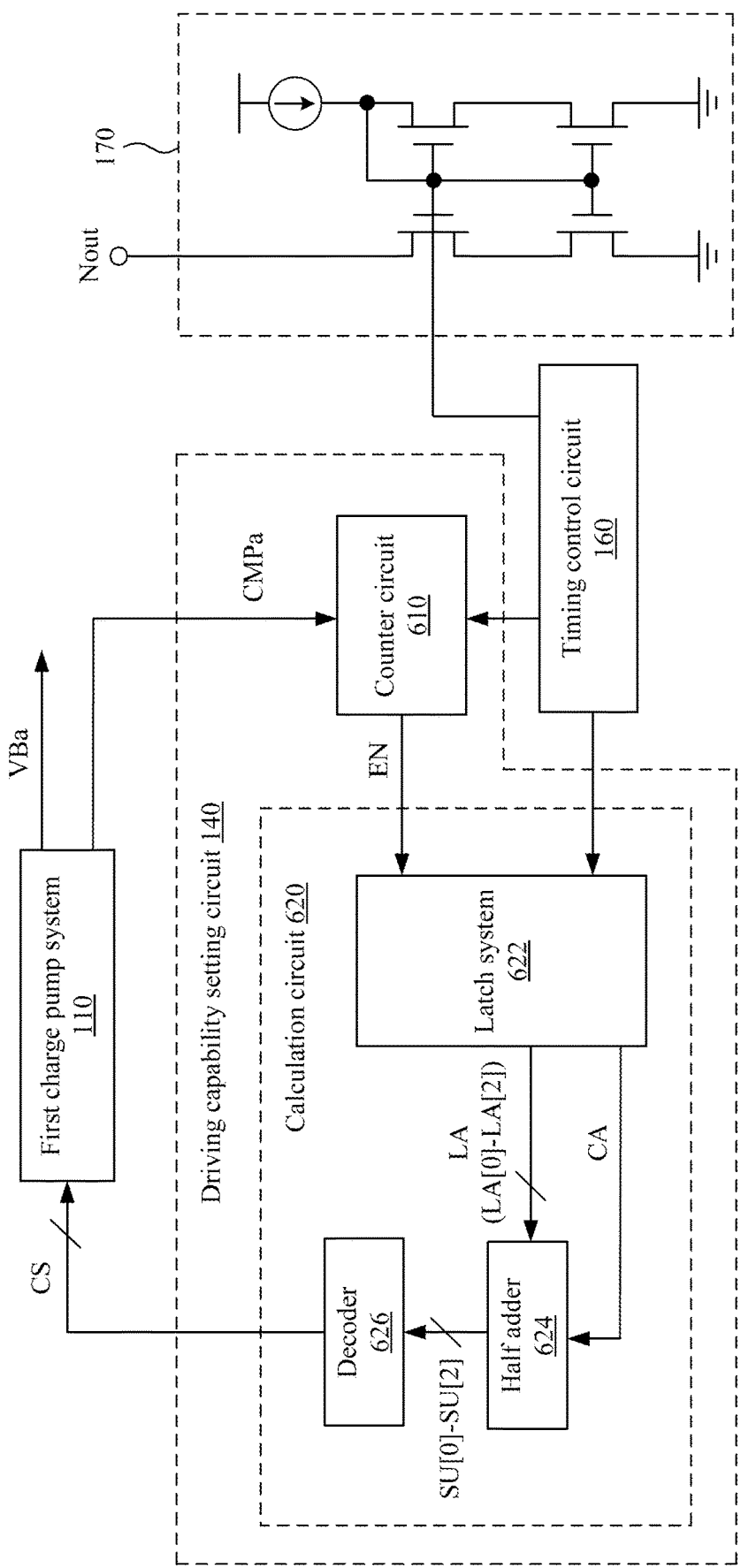
FIG. 6 is a simplified functional block diagram for illustrating the driving capability setting circuit.

FIG. 6 is a simplified functional block diagram for illustrating the driving capability setting circuit 140. The driving capability setting circuit 140 comprises a counter circuit 610 and a calculation circuit 620. The counter circuit 610 is coupled with the first charge pump system 110. Specifically, the counter circuit 610 is coupled with the output terminal of the comparator 250 of FIG. 2 to receive the comparison signal CMPa. Since the comparison signal CMPa is for indicating the comparison result between the first boost voltage VBa and the target boost value as mentioned above, the counter circuit 610 is configured to determine a number of times that the first boost voltage VBa is greater than the target boost value, by configured to count a number of times that the comparison signal CMPa is switched. Once the counted number of times is greater than or equal to a threshold value in a predetermined time period T, the counter circuit 610 outputs an enable signal EN with an enabled level. On the contrary, if the counted number of times is smaller than the threshold value in the predetermined time period T, the enable signal EN has a disabled level. Accordingly, the counter circuit 610 is capable of determining whether the first charge pump system 110 truly has a sufficient driving capability or the comparator 250 is erroneously triggered by noises. The calculation circuit 620 is coupled with the counter circuit 610, and configured to generate the driving capability setting signal CS, in which the calculation circuit 620 may successively adjust the code of the driving capability setting signal CS having a plurality of bits (i.e., the bits CS[0]-CS[6] as shown in FIG. 2).

Reference is made to FIG. 2 and FIG. 6. For adjusting the driving capability setting signal CS, the timing control circuit 160 enables the current mirror 170 to drain an adjustable current from the output node Nout, in order to simulate effects to the first boost voltage VBa caused by the load 101. In this case, if the driving capability of the first charge pump system 110 is insufficient for supplying the current drained by the current mirror 170, the first boost voltage VBa will fall below the target boost value. One of the first charge pump units 210 of the first charge pump system 110 is enabled by default. The calculation circuit 620 may first set all of the bits CS[0]-CS[6] to zero, that is, the driving capability of the first charge pump system 110 is tested by first enabling only one first charge pump unit 210. If the driving capability is insufficient, the calculation circuit 620 may set the bit CS[0] to one (1), while remaining other bits CS[1]-CS[6] as zero, so as to test the driving capability by enabling two first charge pump units 210. If the driving capability is still insufficient, the calculation circuit 620 may set the bits CS[0] and CS[1] to one (1), while remaining the bits CS[2]-CS[6] as zero and so on, until the calculation circuit 620 concludes a code rendering the first boost voltage VBa closest to the target boost value. In some embodiments, all of the first charge pump units 210 are enabled by default when testing the driving capability of the first charge pump system 110, and the calculation circuit 620 may sequentially disable the first charge pump units 210 one by one until the calculation circuit 620 concludes the code rendering the first boost voltage VBa closest to the target boost value. In some embodiments, the code of the driving capability setting signal CS rendering the first boost voltage VBa closest to the target boost value will be stored in a memory circuit (not shown) of the charge pump apparatus 100 for configuring the number of enabled first charge pump units 210 when driving the load 101.

In some embodiments, the calculation circuit 620 adjusts the code of the driving capability setting signal CS by using the binary search algorithm. In specific, calculation circuit 620 comprises a latch system 622, a half adder 624, and a decoder 626. The latch system 622 is coupled with the timing control circuit 160, the counter circuit 610 and the half adder 624, and configured to output a latch signal LA and a carry signal CA to the half adder 624 by executing the binary search algorithm according to the enable signal EN, in which a code of the latch signal LA comprises a plurality of bits LA[0]-LA[2]. The decoder 626 is coupled between the first charge pump system 110 and the half adder 624, and is configured to generate the driving capability setting signal CS according to a calculation result (indicated by bits SU[0]-SU[2]) outputted by the half adder 624. In some embodiments, the decoder 626 is a binary-to-thermal code decoder which transfers the calculation result to the driving capability setting signal CS according to the following Table 1.

TABLE 1

| SU[0] | SU[1] | SU[2] | CS[0] | CS[1] | CS[2] | CS[3] | CS[4] | CS[5] | CS[6] |
| --- | --- | --- | --- | --- | --- | --- | --- | --- | --- |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

Figure 7:
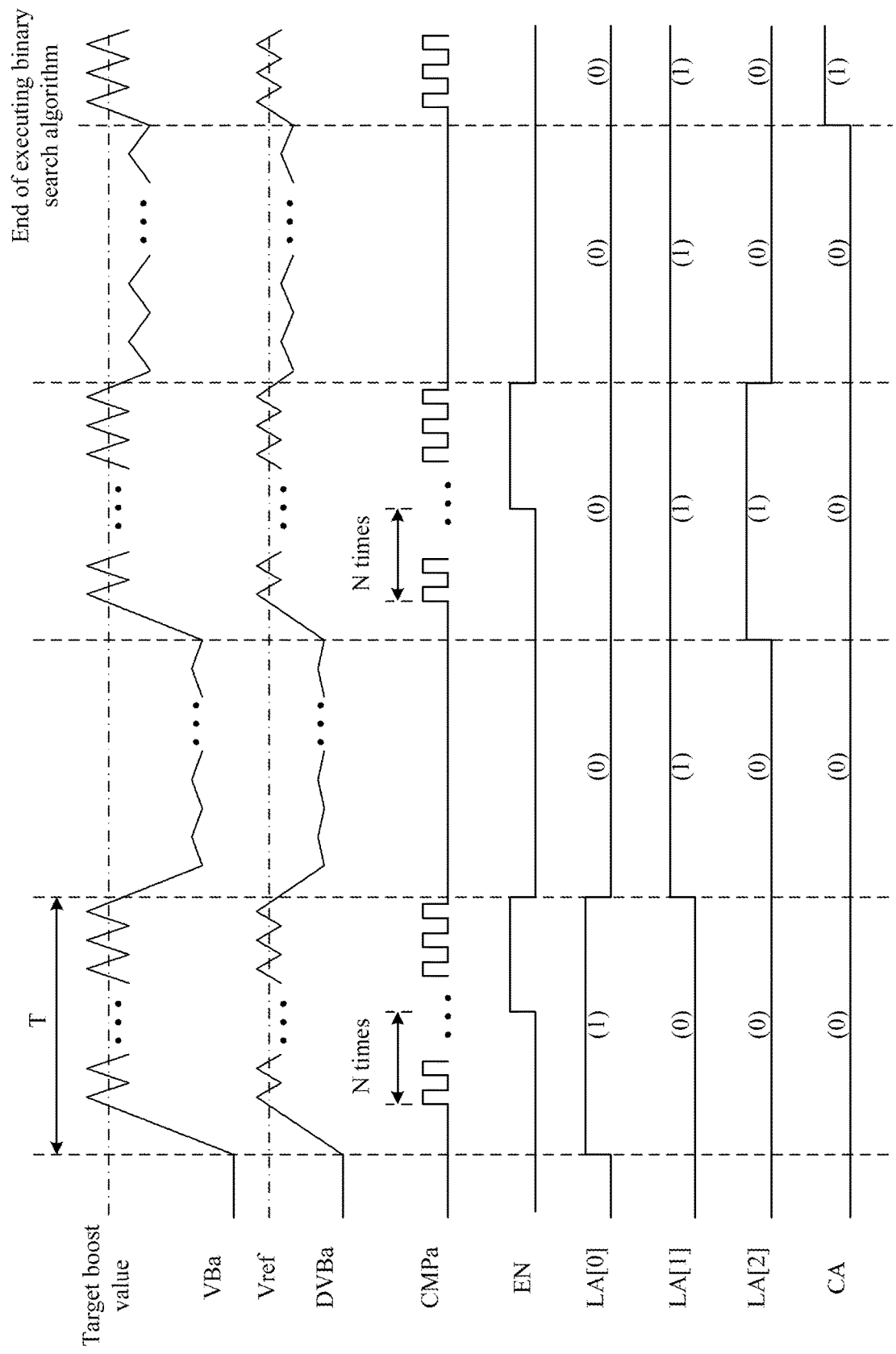
FIG. 7 is a simplified waveform schematic diagram for illustrating the binary search algorithm executed by the latch system.

FIG. 7 is a simplified waveform schematic diagram for illustrating the binary search algorithm executed by the latch system 622. Reference is made to Table 1 and FIGS. 2, 6 and 7. First, the latch system 622 sets MSB of the code of the latch signal LA to one (1), that is, the bits LA[0]-LA[2] are set to "100" to set the bits CS[0]-CS[6] to "0001111" to enable four (4) of the first charge pump units 210. In this case, the first charge pump system 110 is capable of supplying sufficient current to the current mirror 170. The first boost voltage VBa is higher than the target boost value for multiple times greater than the threshold value, and thus the divided first boost voltage DVBa is higher than the reference voltage Vref for multiple times, causing the comparison signal CMPa being switched for multiple times. In a predetermined time period T, since the counter circuit 610 determines that the comparison signal CMPa is switched for more than the threshold value (e.g., N times, where N is a positive integer), the counter circuit 610 switches the enable signal EN to the enable level.

After receiving the enable signal EN having the enable level, the latch system 622 decrease the driving capability of the first charge pump system 110 accordingly, by setting the bits LA[0]-LA[2] to "010" to enable two which is half of the previous value (i.e. four) of the first charge pump units 210. In this situation, the first boost voltage VBa and the divided first boost voltage DVba fall below the target boost value and the reference voltage Vref, respectively. The enable signal EN therefore has the disable voltage level to inform the latch system 622 to increase the driving capability of the first charge pump system 110, and so on. The binary search algorithm is apparent to those of ordinary skill in the art, and thus the rest of the search process is omitted here.

In some embodiments, the LSB of the code of the latch signal LA (i.e., the bit LA[2]) is zero after the end of executing the binary search algorithm, that is, the first boost voltage VBa is smaller than the target boost value or the divided first boost voltage DVBa is smaller than the reference voltage Vref. In this situation, the latch system 622 switches the code of the carry signal CA from zero to one (1), so that the calculation result (i.e., the bits SU[0]-SU[2]) of the half adder 624 will be the code of the latch signal LA added by one (1). As a result, the number of the enabled first charge pump units 210 will be increased by a predetermined number, for example, one (1). For example, as shown in FIG. 7, the bits LA[0]-LA[2] are "010" after the end of executing the binary search algorithm, and thus the code of the carry signal CA are switched from zero to one (1), resulting the bits SU[0]-SU[2] to be set to "011." On the contrary, if the LSB of the code of the latch signal LA is one (1) after the end of executing the binary search algorithm, the latch system 622 remains the carry signal CA as zero. As a result, the driving capability of the first charge pump system 110 is ensured to be sufficient for the load 101.

In the circumstance that the first charge pump system 110 has K first charge pump units 210 and K is a considerably large integer, the number of search times by using the binary search algorithm is $\log_2 K$. This is dramatically smaller than that of testing the driving capability of the first charge pump system 110 by sequentially enabling or disabling the first charge pump units 210 one by one.

In some embodiments, the charge pump apparatus 100 determines the number of enabled first charge pump units 210 before determining the magnitude of the second boost voltage VBb. The purpose of this is to first ensure the driving current supplied to the load 101 is sufficient, and then further adjust the output voltage Vo precisely.

In some embodiments, one of the driving capability setting circuit 140 and the voltage regulation circuit 150 may be omitted from the charge pump apparatus 100, so as to reduce the overall circuit area.

In some embodiments, the current mirror 170 drains a first current when adjusting the driving capability setting signal CS, and drains a second current when adjusting the voltage regulation signal VR, in which the first current is greater than the second current. In other embodiments, a current mirror being used when adjusting the driving capability setting signal CS is different from that of used when adjusting the voltage regulation signal VR.

Figure 8:
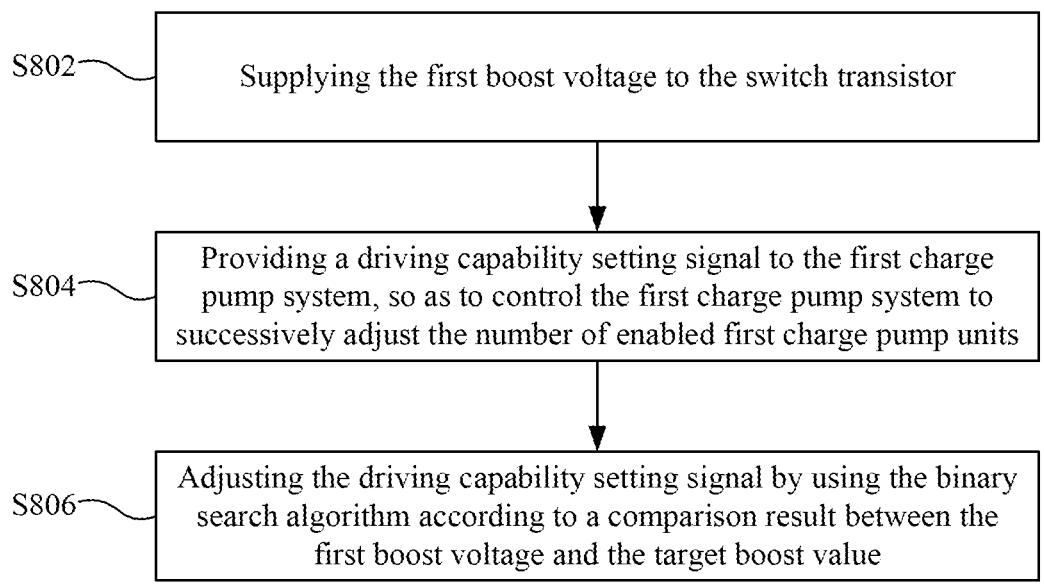
FIG. 8 is a flowchart for illustrating a configuration process of the first charge pump system according to one embodiment of the present disclosure.
Figure 9:
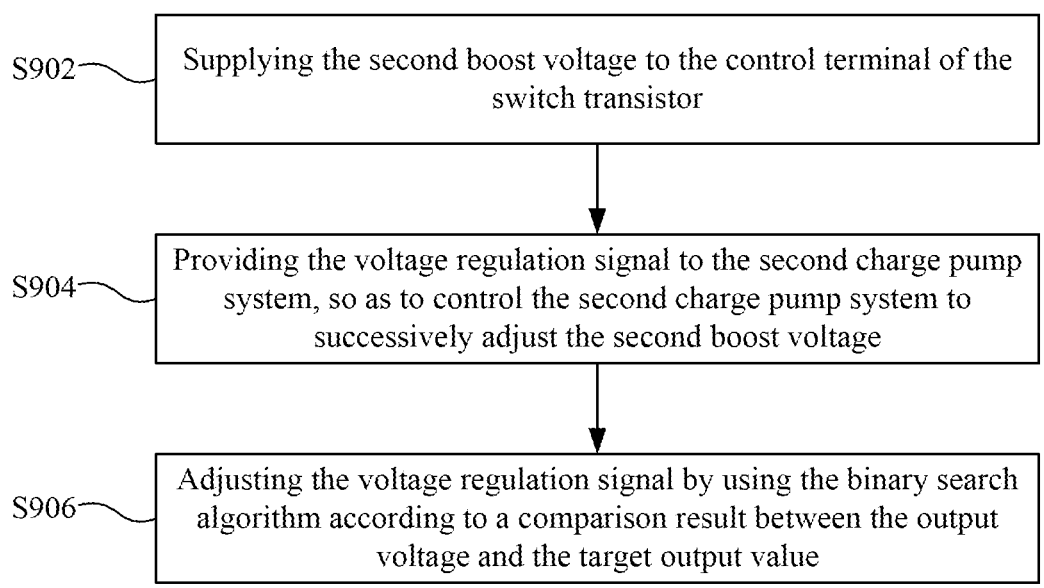
FIG. 9 is a flowchart for illustrating a configuration process of the second charge pump system according to one embodiment of the present disclosure.

A calibration method suitable for the charge pump apparatus 100 of FIG. 1 will be illustrated with FIGS. 8 and 9. FIG. 8 is a flowchart 800 for illustrating the configuration process of the first charge pump system 110. FIG. 9 is a flowchart 900 for illustrating the configuration process of the second charge pump system 120. As shown in FIG. 8, the first charge pump system 110 supplies the first boost voltage VBa to the switch transistor 130 in operation S802. In operation S804 and S806, the driving capability setting circuit 140 controls, according to the first boost voltage VBa, the first charge pump system 110 to successively adjust a number of enabled first charge pump units 210, so that the first boost voltage VBa successively approaches to the target boost value.

In specific, the driving capability setting circuit 140 provides a driving capability setting signal CS to the first charge pump system 110 in operation S804, so as to control the first charge pump system 110 to successively adjust the number of enabled first charge pump units 210. In operation S806, the driving capability setting circuit 140 adjusts the code of the driving capability setting signal CS by using the binary search algorithm according to a comparison result between the first boost voltage VBa and the target boost value, as aforementioned in the embodiments regarding to FIGS. 6 and 7.

As shown in FIG. 9, the second charge pump system 120 supplies the second boost voltage VBb to the control terminal of the switch transistor 130 in operation S902. In operation S904 and S906, the voltage regulation circuit 150 controls, according to the output voltage Vo, the second charge pump system 120 to successively adjust the second boost voltage VBb so that the output voltage Vo successively approaches to the target output value.

Specifically, the voltage regulation circuit 150 provides the voltage regulation signal VR to the second charge pump system 120 to control the second charge pump system 120 in operation S904 to successively adjust the second boost voltage VBb. In operation S906, the voltage regulation circuit 150 adjusts the code of the voltage regulation signal VR by using the binary search algorithm according to a comparison result between the output voltage Vo and the target output value, as aforementioned in the embodiments regarding to FIGS. 4 and 5.

In some embodiments, when operations S806 and 906 are conducted, the charge pump apparatus 100 drains currents with the same or different magnitude from the output node Nout through one or more current mirrors (e.g., the current mirror 170), so as to simulate effects caused by the load 101.

In the calibration method suitable for the charge pump apparatus 100, operations in the flowchart 800 may be conducted in parallel with operations in the flowchart 900. In some embodiments, one or more of operations in the flowcharts 800 and 900 may be omitted from the calibration method. For example, operations S804 and S806 may be omitted. As another example, operations S904 and S906 may be omitted.

As can be appreciated from the above descriptions, by setting the current drained by the current mirror 170 according to different loads, the charge pump apparatus 100 is capable of determining a suitable driving capability thereof. The output voltage Vo of the charge pump apparatus 100 is almost not affect by process variation, since the voltage regulation circuit 150 can adaptively control the degree of conduction of the switch transistor 130 according to the electrical characteristics of the switch transistor 130. Further, the charge pump apparatus 100 is suitable for high-speed operation, since the use of binary search algorithm facilities to find out suitable output currents and output voltages in a short time period.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. A charge pump apparatus, comprising:
   a first charge pump system, configured to convert a first supply voltage into a first boost voltage;
   a second charge pump system, configured to convert a second supply voltage the same or different from the first supply voltage into a second boost voltage;
   a switch transistor, coupled to the first charge pump system and the second charge pump system, and configured to output an output voltage according to the second boost voltage, wherein the switch transistor comprises a control terminal receiving the second boost voltage, a first terminal receiving the first boost voltage, and a second terminal outputting the output voltage; and
   a voltage regulation circuit, coupled between the second terminal and the second charge pump system, and configured to control the second charge pump system according to the output voltage to adjust the second boost voltage so that the output voltage approaches to a target output value
   wherein the second charge pump system is configured to generate the second boost voltage according to a voltage regulation signal provided by the voltage regulation circuit,
   wherein the voltage regulation circuit adjusts the voltage regulation signal by using a binary search algorithm according to a comparison result between the output voltage and the target output value.

2. The charge pump apparatus of claim 1, wherein the voltage regulation circuit comprises:
   a voltage dividing circuit, configured to divide the output voltage to generate a divided output voltage;
   a comparator, configured to compare the divided output voltage with a reference voltage corresponding to the target output value to output a comparison signal; and
   a calculation circuit, coupled with an output node of the comparator, and configured to output the voltage regulation signal to the second charge pump system to control the second charge pump system to adjust the second boost voltage, wherein the calculation circuit adjusts the voltage regulation signal according to the comparison signal.

3. The charge pump apparatus of claim 2, wherein the calculation circuit is configured to adjust the voltage regulation signal by using the binary search algorithm according to the comparison signal.

4. The charge pump apparatus of claim 1, further comprising:
   a driving capability setting circuit, coupled with the first charge pump system comprising a plurality of first charge pump units;
   wherein the driving capability setting circuit is configured to control, according to the first boost voltage, the first charge pump system to adjust a number of enabled first charge pump units of the plurality of first charge pump units, so that the first boost voltage approaches to a target boost value.

5. The charge pump apparatus of claim 4, wherein the first charge pump system adjusts the number of enabled first charge pump units according to a driving capability setting signal provided by the driving capability setting circuit,
   wherein the driving capability setting circuit adjusts the driving capability setting signal by using the binary search algorithm according to a comparison result between the first boost voltage and the target boost value.

6. The charge pump apparatus of claim 4, wherein the driving capability setting circuit comprises:
   a counter circuit, coupled with the first charge pump system, and configured to compare a number of times, that the first boost voltage is greater than the target boost value in a predetermined time period, with a threshold value to output an enable signal; and
   a calculation circuit, coupled with the counter circuit, and configured to provide a driving capability setting signal to the first charge pump system to control the first charge pump system to adjust the number of enabled first charge pump units, wherein the calculation circuit adjusts the driving capability setting signal according to the enable signal.

7. The charge pump apparatus of claim 6, wherein the calculation circuit is configured to adjust the driving capability setting signal by using the binary search algorithm according to the enable signal.

8. The charge pump apparatus of claim 7, wherein if the first boost voltage is smaller than the target boost value after the binary search algorithm is finished, the calculation circuit controls the first charge pump system to increase the number of enabled first charge pump units by a predetermined number.

9. The charge pump apparatus of claim 7, wherein the calculation circuit comprises:
   a latch system, configured to execute the binary search algorithm according to the enable signal to output a latch signal and a carry signal, wherein if the first boost voltage is smaller than the target boost value after the binary search algorithm is finished, the latch system switches the carry signal from zero to one;

a half adder, configured to add up the latch signal and the carry signal; and a decoder, configured to transfer an output of the half adder to the driving capability setting signal.

10. The charge pump apparatus of claim 1, wherein the switch transistor is a native transistor.

11. The charge pump apparatus of claim 1, further comprising:

a current mirror, coupled with the second terminal of the switch transistor, and configured to drain a current from the second terminal of the switch transistor when the second charge pump system adjusts the second boost voltage.

12. A calibration method, suitable for a charge pump apparatus comprising a first charge pump system, a second charge pump system, and a switch transistor, wherein the calibration method comprises:

supplying a first boost voltage to a first terminal of the switch transistor by the first charge pump system;

supplying a second boost voltage to a control terminal of the switch transistor by the second charge pump system, wherein the switch transistor further comprises a second terminal configured to output an output voltage; and controlling, according to the output voltage, the second charge pump system to adjust the second boost voltage so that the output voltage approaches to a target output value, wherein controlling the second charge pump system to adjust the second boost voltage comprises:

providing a voltage regulation signal to the second charge pump system to control the second charge pump system to adjust the second boost voltage; and adjusting the voltage regulation signal by using a binary search algorithm according to a comparison result between the output voltage and the target output value.

13. The calibration method of claim 12, wherein the first charge pump system comprises a plurality of first charge pump units, and the calibration method further comprises:

controlling, according to the first boost voltage, the first charge pump system to adjust a number of enabled first charge pump units of the plurality of first charge pump units, so that the first boost voltage approaches to a target boost value.

14. The calibration method of claim 13, wherein controlling the first charge pump system to adjust the number of enabled first charge pump units comprises:

providing a driving capability setting signal to the first charge pump system to control the first charge pump system to adjust the number of enabled first charge pump units; and adjusting the driving capability setting signal by using the binary search algorithm according to a comparison result between the first boost voltage and the target boost value.

15. The calibration method of claim 12, further comprising:

draining a current from the second terminal of the switch transistor when the second charge pump system adjusts the second boost voltage.

16. A charge pump apparatus, comprising:

a first charge pump system, configured to convert a first supply voltage into a first boost voltage, and comprising a plurality of first charge pump units;

a second charge pump system, configured to convert a second boost voltage the same or different from the first supply voltage into a second boost voltage; and a switch transistor, coupled to the first charge pump system and the second charge pump system, and configured to output an output voltage according to the second boost voltage, wherein the switch transistor comprises a control terminal receiving the second boost voltage, a first terminal receiving the first boost voltage, and a second terminal outputting the output voltage; and a driving capability setting circuit, coupled with the first charge pump system;

wherein the driving capability setting circuit is configured to control, according to the first boost voltage, the first charge pump system to adjust a number of enabled first charge pump units of the plurality of first charge pump units, so that the first boost voltage approaches to a target boost value.

17. The charge pump apparatus of claim 16, wherein the first charge pump system adjusts the number of enabled first charge pump units according to a driving capability setting signal provided by the driving capability setting circuit, wherein the driving capability setting circuit adjusts the driving capability setting signal by using a binary search algorithm according to a comparison result between the first boost voltage and the target boost value.

18. The charge pump apparatus of claim 16, wherein the driving capability setting circuit comprises:

a counter circuit, coupled with the first charge pump system, and configured to compare a number of times, that the first boost voltage is greater than the target boost value in a predetermined time period, with a threshold value to output an enable signal; and a calculation circuit, coupled with the counter circuit, and configured to provide a driving capability setting signal to the first charge pump system to control the first charge pump system to adjust the number of enabled first charge pump units, wherein the calculation circuit adjusts the driving capability setting signal according to the enable signal.

\* \* \* \* \*